(12) United States Patent
Hurkx et al.

(10) Patent No.: US 6,436,779 B2
(45) Date of Patent: Aug. 20, 2002

(54) SEMICONDUCTOR DEVICE HAVING A PLURALITY OF RESISTIVE PATHS

(75) Inventors: Godefridus A. M. Hurkx, Best; Rob Van Dalen, Eindhoven, both of (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/781,498

(22) Filed: Feb. 12, 2001

(30) Foreign Application Priority Data

Feb. 12, 2000 (GB) ............................. 0003184

(51) Int. Cl.[7] .................. H01L 29/76; H01L 29/94; H01L 31/062; H01L 31/113; H01L 31/119
(52) U.S. Cl. .................... 438/339; 438/374; 438/487
(58) Field of Search ................. 257/287, 338, 257/339, 478, 483, 484, 487, 489, 496, 374, 373

(56) References Cited

U.S. PATENT DOCUMENTS

| 4,611,384 | A | * | 9/1986 | Bencuya et al. ..... 148/DIG. 82 |
| 4,646,115 | A | | 2/1987 | Shannon et al. ............ 357/15 |
| 4,754,310 | A | | 6/1988 | Coe ............................ 357/13 |
| 6,184,555 | B1 | * | 2/2001 | Tihanyi et al. ............. 257/329 |
| 6,303,969 | B1 | * | 10/2001 | Tan ............................ 257/471 |

FOREIGN PATENT DOCUMENTS

DE 19848828 A 5/2000

* cited by examiner

Primary Examiner—Olik Chaudhuri
Assistant Examiner—Hoai Pham
(74) Attorney, Agent, or Firm—Steven R. Biren

(57) ABSTRACT

A semiconductor device has first and second opposed major surfaces (10a and 10b). A semiconductor first region (11) is provided between second (12 or 120) and third (14) regions such that the second region (12 or 120) forms a rectifying junction (13 or 130) with the first region (11) and separates the first region (11) from the first major surface (10a) while the third region (14) separates the first region (11) from the second major surface (10b). A plurality of semi-insulating or resistive paths (21) are dispersed within the first region (1') such that each path extends through the first region from the second to the third region. In use of the device when a reverse biasing voltage is applied across the rectifying junction (13 or 130) an electrical potential distribution is generated along the resistive paths (21) which causes a depletion region in the first region (11) to extend through the first region (11) to the third region (14) to increase the reverse breakdown voltage of the device. The device may be, for example a pn-n diode in which case the second region is a semiconductive region of the opposite conductivity type to the first region or a Schottky diode in which case the second region (120) forms a Schottky contact with the first region.

13 Claims, 2 Drawing Sheets

SEMICONDUCTOR DEVICE HAVING A PLURALITY OF RESISTIVE PATHS

BACKGROUND OF THE INVENTION

This invention relates to a semiconductor device and a method of fabricating material for a semiconductor device.

It is well known in the semiconductor art that the spread of the depletion region of a reverse-biased rectifying junction (and so breakdown voltage of that junction) can be increased by reducing the dopant concentration and increasing the size of a semiconductor region associated with the rectifying junction. However, although this enables the reverse breakdown voltage to be increased, it also increases the resistivity and length of the current path through the device when the rectifying junction is forward biased in the ON condition of the device. This means that the series resistivity of the current path for majority charge carriers through the device increases in proportion to approximately the square of the desired reverse breakdown voltage, so limiting the current handling capability of the device for a given maximum thermal dissipation.

U.S. Pat. No. 4,754,310 (our reference PHB32740) addresses this problem by providing one of the regions forming the rectifying junction as a zone formed of first regions of one conductivity type interposed with second regions of the opposite conductivity type with the dopant concentrations and dimensions of the first and second regions being such that, when the rectifying junction is reversed biased in operation and the zone is depleted of free charge carriers, the space charge per unit area in the first and second regions balances at least to the extent that the electric field resulting from the space charge is less than the critical field strength at which avalanche breakdown would occur. This enables the required reverse breakdown voltage characteristics to be obtained using interposed semiconductor regions which individually have a higher dopant concentration, and thus lower resistivity, than would otherwise be required so that the series resistivity of the first and second regions and thus the ON resistance of the device can be lower than for conventional devices.

SUMMARY OF THE INVENTION

It is an aim of the present invention to provide another way of improving the trade off between breakdown voltage and on resistance in vertical high voltage semiconductor devices where the word "vertical" should be understood to mean that the main current flow path through the device is between first and second main opposed surfaces of the device.

According to one aspect of the present invention there is provided a semiconductor device wherein semi-insulative or leakage current paths are provided through a semiconductor region associated with a rectifying junction so that, when the rectifying junction is reversed biased in operation, the electrical potential distribution along the semi-insulative or leakage current paths causes the depletion region within the semiconductor region to spread through the semiconductor region to a greater extent than it would have done without the presence of the semi-insulative or leakage current paths so that the semiconductor region can be fully depleted of free charge carriers to enable the required reverse breakdown voltage to be achieved using semiconductor material that has a lower resistivity than would be required to achieve that breakdown voltage in the absence of the semi-insulating or leakage current paths.

In one aspect, the present invention provides a semiconductor device having first and second opposed major surfaces, the semiconductor device comprising a semiconductor first region provided between second and third regions such that the second region forms a rectifying junction with the first region and separates the first region from the first major surface and the third region separates the first region from the second major surface, the first region having dispersed therein a plurality of resistive paths each extending through the first region from the second toward the third region and each electrically isolated from the first region, for example by an intervening insulating layer, such that, in use, when a reverse biasing voltage is applied across the rectifying junction an electrical potential distribution is generated along the resistive paths which causes a depletion region in the first region to extend further through the first region to increase the reverse breakdown voltage of the device.

According to an aspect of the present invention, there is provided a semiconductor device as set out in claim 1. The present invention also provides a method as set out in claim 10.

The present invention thus enables a semiconductor device or material for forming a semiconductor device to be provided which enables the trade off between reverse breakdown voltage and on resistance to be improved in a manner that is different from that proposed in U.S. Pat. No. 4,754,310 and that may, at least in certain circumstances, be simpler and/or more economical to manufacture.

Other advantageous technical features in accordance with the present invention are set out in the appended dependent claims.

BRIEF DESCRIPTION OF THE DRAWING

Embodiments of the present invention will now be described, by way of example, with reference to the accompanying diagrammatic drawings, in which.

It should be noted that (with the exception of FIG. 4) the Figures are diagrammatic, relative dimensions and proportions of parts having been shown exaggerated or reduced in size for the sake of clarity and convenience. The same reference signs are generally used to refer to corresponding or similar features in the different embodiments.

DESCRIPTION OF THE PREFERRED EMBODIMENTS

Figure 1:
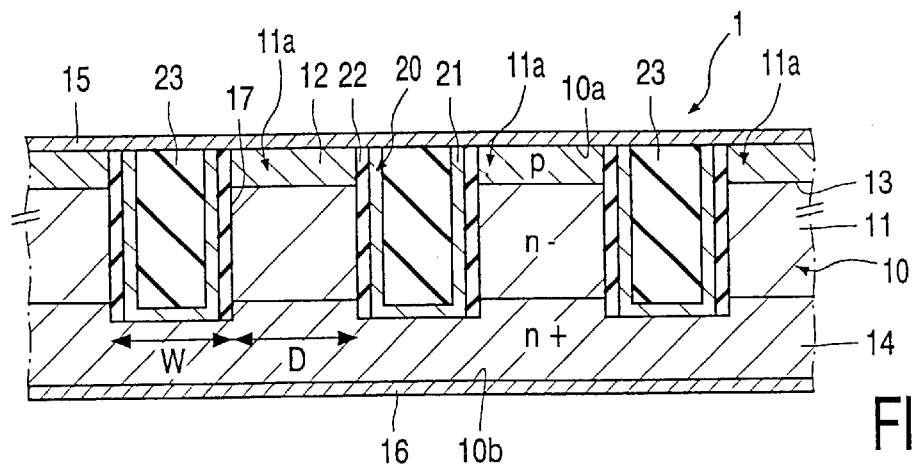
FIG. 1 shows a diagrammatic cross-sectional view through part of a first embodiment of a semiconductor device in accordance with the present invention.

Referring now to FIG. 1, this shows a semiconductor device 1 in the form of a pn-n rectifier or diode. The semiconductor device 1 comprises a monocrystalline silicon semiconductor body 10 having first and second opposed major surfaces 10a and 10b. The semiconductor body 10 comprises a first relatively lowly doped semiconductor region 11 of one conductivity type, n-conductivity type in this example. Typically, the dopant concentration within the semiconductor first region 11 is $10^{16}$ atom $cm^{-3}$. The semiconductor first region 11 is separated from the first major surface 10a by a semiconductor second region 12 of the opposite conductivity type (P conductivity type in this example) so that a pn junction 13 is formed between the semiconductor first and second regions 11 and 12. Typically the semiconductor second region 12 will have a dopant concentration of $10^{19}$ atoms $cm^{-3}$.

The first region 11 is separated from the second major surface 10b by a third region 14 of the same conductivity type but more highly doped (n+conductivity type in this example) than the first region 11. The second region 12 forms an ohmic contact with a first metallisation layer 15 forming one electrode of the diode while the third region 14 forms an ohmic contact with a second metallisation layer 16 forming the other electrode of the diode.

The structure of the diode 1 described so far forms a conventional pn-n diode. However, in contrast to a conventional pn-n diode, the diode 1 shown in FIG. 1 has a plurality of electric field shaping regions 20 extending through the first region 11 from the second region 12 to the third region 14.

In the embodiment shown in FIG. 1, each field shaping region comprises a layer 21 of semi-insulating or highly resistive material deposited in a corresponding opening 17 extending from the first major surface 10a through the second and first regions 12 and 11 and just to or as shown into the third region 14. The resistive or semi-insulating layer 21 may be, for example, a layer of polycrystalline silicon doped with oxygen and/or nitrogen so as to have, for example, a resistivity of from about $10^7$ to about $10^9$ ohm cm or may be a layer of silicon nitride having a resistivity of, for example, from about $10^7$ ohm cm to about $10^9$ ohm cm. The semi-insulating layer 21 is separated from the walls of the opening 17 by a layer 22 of an insulating material, typically silicon dioxide. Typically, the semi-insulating layer 21 will have a thickness of 0.5 μm (micrometres) while the insulating layer 22 will have a thickness of, for example, 30 nm (nanometres). To provide a planar first major surface 10a for the metallisation 15, the opening 17 is filled with a filler material 23 formed of an appropriate insulating material such as TEOS (Tetraethylorthosilicate).

Typically, the first region 11 will have a thickness of from 3 to 30 μm and, when viewed in plan looking down on the first major surface 10a, the opening 17 will be in the form of a continuous trench having a regular grid or mesh-like structure bounding areas 11a which are square, hexagonal or circular and arranged in a regular matrix or array so that the resistive paths 21 form a continuous grid-like region. As another possibility, a stripe-like geometry may be adopted. Typically, there will be many thousands of areas 11a in a device. In an embodiment, the areas 11a bounded by the grid-like opening 17 may be square when viewed looking down on the first major surface 10a and may be arranged in a square matrix so that the width D of each area 11a is the same as the width W of the opening 17 and is, for example, 2 or 4 micrometres. The product of the dopant concentration [n-]and width D of the areas 11a of the n- region 11, that is D*[n-], should be about $2\times10^{12}$ $cm^{-2}$ atoms as set out in U.S. Pat. No. 4754310.

Figure 2:
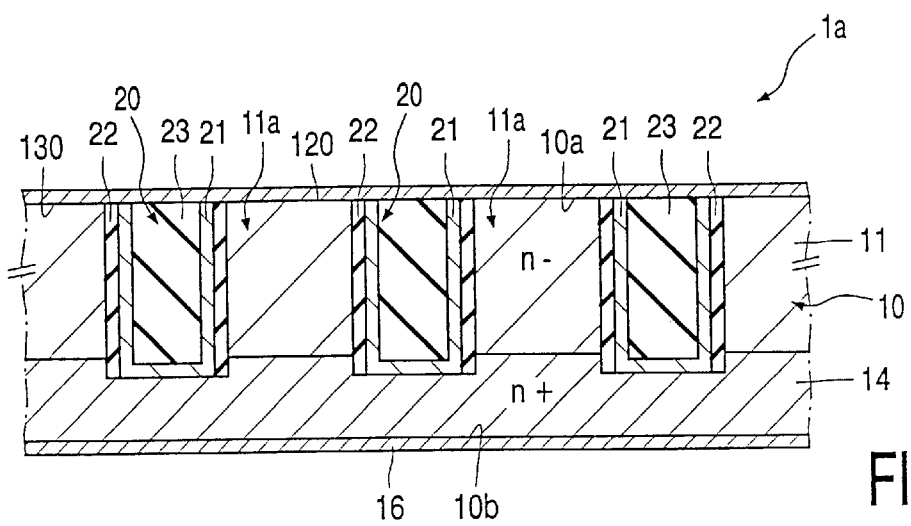
FIG. 2 shows a diagrammatic cross-sectional view similar to FIG. 1 through part of a second embodiment of a semiconductor device in accordance with the present invention.

FIG. 2 shows another example of a semiconductor diode 1a in accordance with present invention. The semiconductor diode 1a shown in FIG. 2 differs from that shown in FIG. 1 in that the second region 12 is not a semiconductor region but is a Schottky metal region 120 which forms a Schottky junction 130 with the first region. The Schottky metal region 120 also forms at least part of the electrode 15. The region 120 may be formed of, for example, a silicide such as platinum silicide.

Figure 3:
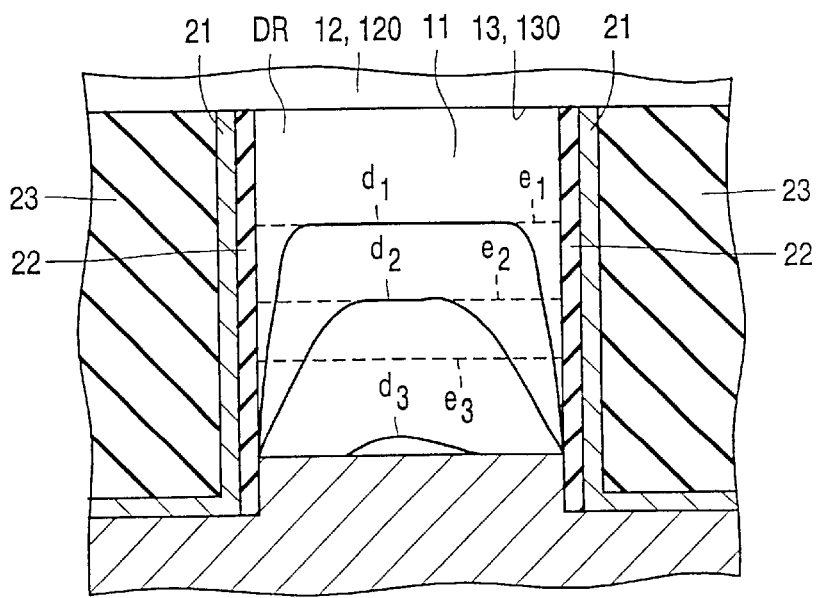
FIG. 3 shows part of the device of FIGS. 1 or 2 on an enlarged scale to illustrate operation of the device under reverse bias.

FIG. 3 shows part of the diode 1 or 1a on an enlarged scale to illustrate the effect of providing the field shaping regions or resistive paths. For the sake of this illustration, the first region 11 is shown unhatched. When the rectifying junction 13, 130 is reverse biased in operation, a small leakage current flows through each of the resistive paths 21 causing a linear electrical potential drop along the resistive paths 21 so that the vertical electrical field near the interface between the insulating layer 22 and the first region 11 is substantially constant. FIG. 3 illustrates the change in the extent of the depletion region DR with increasing reverse biasing voltage across the rectifying junction 13 with the solid lines d1 to d3 illustrating the extent of the depletion region DR and the dash lines e1 to e3 illustrating what the extent of the depletion region would have been in the absence of the resistive paths 21. As shown by the line d1, at relatively low reverse biasing voltages, the resistive paths 21 cause the depletion region DR to extend towards the third region 14. As the reverse biasing voltage is increased and thus the electrical potential difference along the resistive paths 21 increases, the portions of the depletion region adjacent to the resistive paths 21 expand until, as shown by the line d3, the depletion regions merge so that the first region 11 is substantially entirely depleted of free charge carriers. If the pitch between adjacent resistive paths 21 is sufficiently small (typically 2 to 4 micrometres for a dopant concentration in the first region of $10^{16}$ atoms $cm^{-3}$), the electrical field will be constant nearly everywhere before the critical field for avalanche breakdown is reached in the first region 11 so allowing the same reverse breakdown voltage characteristics to be achieved with a dopant concentration in the first region 11 that is much higher than would be possible without the field shaping regions 20. A pn-n diode having a reverse breakdown voltage of 400V (a 400V pn-n diode) can be achieved using a 2 μm pitch (W=D=2 μm) and a dopant concentration in the first region 11 of $10^{16}$ $cm^{-3}$. In contrast, to achieve a 400V pn-n diode with a conventional structure (that is without the field shaping regions 20) would require a dopant concentration in the n- or first region of $7\times10^{14}$ $cm^{-3}$ resulting in a much higher resistivity in the on state.

Figure 4:
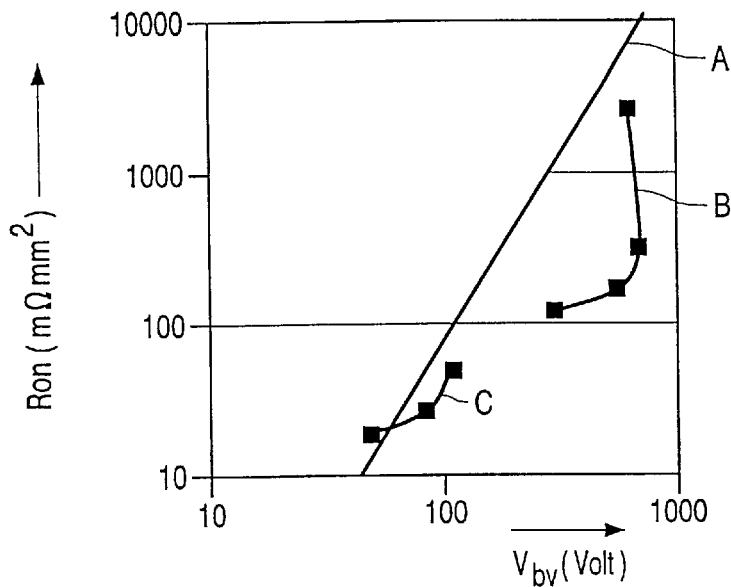
FIG. 4 shows a graph of on-resistance (Ron) against reverse breakdown voltage (Vbv) to illustrate the effect of the present invention.

FIG. 4 shows a graph of on-resistance (Ron) in milli Ohms per millimetre squared against reverse breakdown voltage (Vbv) in volts. In FIG. 4 the line A shows the theoretical silicon 1D limit while lines B and C show the limits that can be achieved by a silicon diode in accordance with the present invention with a pitch (W or D in FIG. 1) of 4 micrometres and, in the case of line B, a first region 11 thickness of 30 micrometres and, in the case of line C, a first region thickness of 5 micrometres. At least for certain combinations of first region thickness and required reverse breakdown voltage, the present invention enables an improved trade off between on resistance and breakdown voltage to be achieved which is similar to that which can be achieved using the invention disclosed U.S. Pat. No. 4,754,310 without needing the balancing of the dopant concentrations required by U.S. Pat. No. 4754310.

Figure 5:
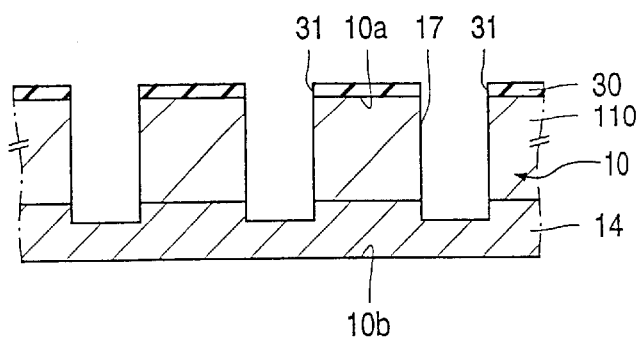
FIGS. 5 to 7 illustrates steps in one example of a method that may be used in manufacturing the semi-conductor device shown in FIG. 1 or FIG. 2.
Figure 6:
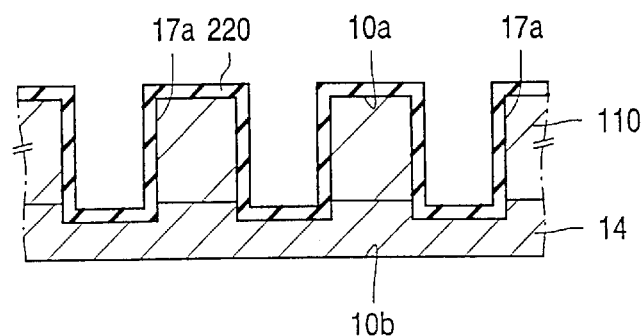
Figure 7:
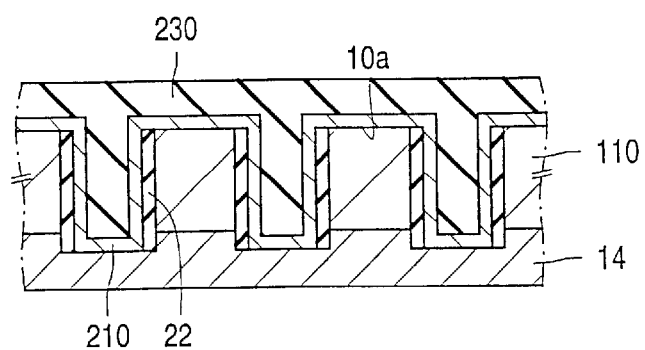

FIGS. 5 to 7 illustrate cross-sectional views of part of a semiconductor body to illustrate steps in one method of manufacturing a semiconductor diode 1 as shown in FIG. 1 or semiconductor diode 1a as shown in FIG. 2. Initially a semiconductor body 10 is provided consisting of a n+conductivity type substrate for forming the third region 14. An n-conductivity type epitaxial layer 110 is grown on the substrate 14 for forming the first region 11. A masking layer 30 (for example a silicon dioxide or silicon nitride layer or a resist layer) is provided on the surface of the epitaxial layer 110 and patterned using conventional photolithographic techniques to define windows 31 in the masking layer 30. An an isotropic etching process is then carried out as is known in the art to define the opening 17 extending through the epitaxial layer 110 into the substrate 14 to produce the structure shown in FIG. 5.

The masking layer 30 is then removed using conventional masking layer removal techniques and, after cleaning of the exposed surface, a thermal oxide layer 220 is grown on the exposed silicon surface as shown in FIG. 6. The thermal oxide layer 220 is then subjected to an an isotropic etching process to leave the oxide only on the side walls 17a of the opening 17 so as to form the insulating layers 22. A layer 210 of semi-insulating or resistive material, in this case oxygen doped polycrystalline silicon or semi-insulating silicon nitride, is then deposited using known chemical vapour deposition techniques. A filler material such as, for example, TEOS is then deposited over the semi-insulating layer 210 to form a layer 230 having a relatively planar exposed surface. The layers 230 and 210 are then etched back using a conventional etching technique which etches the material of the layer 230 at the same rate as the material of the layer 210 to produce the structure shown in FIG. 2 but without the metallisation layers 120 and 16. Where the pn-n diode 1 is being manufactured, the conductivity type impurities are then introduced through the first major surface 10a to form the second region 12. As another possibility the implantation may be carried out before etching the opening 17. Metallisation is then deposited in known manner to form the electrodes 15 and 16 to produce the diode shown in FIG. 1. Where the Schottky diode 1b in FIG. 2 is being produced, then after etching back of the layers 230 and 210 to expose the surface 10a, the Schottky metal 120 is deposited on the surface 10a and the electrode metallisation 16 is provided on the surface 10b as shown in FIG. 2.

In the embodiments described above, the resistive paths 21 are separated from the first region 11 by the insulating layers 22. The thickness of the insulating layer 22 is determining by the required ruggedness and speed of the device and therefore depends upon the magnitude of the electric field within the device during switching transients. As set out above, typically the insulating layer 22 may have a thickness of 30 nm. The insulating layer 22 serves to achieve a linear potential drop or difference along the resistive paths 21 because it inhibits or at least reduces the possibility of conduction between the resistive paths 21 and the first region 11. However, the resistive paths 21 will still serve to increase the spread of the depletion region towards the third region 14 even in the absence of the insulating layers 21 and, although the electrical potential along the resistive paths will be less linear without the insulating layers 22, the effects of the present invention may be achieved without the insulating layers, especially in the case where the semi-insulating material is oxygen doped polycrystalline silicon (SIPOS).

The filler material 23 is provided to enable a substantially planar surface to be provided onto which the subsequent metallisation 15 can be deposited. Where such a planar surface is not essential, then it may be possible to omit the filler material. Also, the diode 1 or 1a could be designed so that the relative dimensions of the openings 17 and the thicknesses of the resistive paths 21 are such that the material of the resistive paths 21 substantially fills the opening 17 so that there is no need for any filler material.

Having a wider 10 opening 17 facilitates deposition of material into the opening whereas having a narrower opening 17 means that a filler material may not be necessary and it should be possible to achieve a lower on resistance because there will be a wider path through the n- first region 11.

It will, of course, be appreciated that the present invention may also be applied where the conductivity types given above are reversed and that semiconductor materials other than silicon may be used such as germanium or germanium silicon alloys.

In the above described embodiments, the opening 17 forms a continuous trench having a grid-like structure. However the situation may be reversed so that the areas 11a form a grid-like structure and a plurality of discrete openings 17 are provided.

In the above described examples, the resistive paths are provided by a semi-insulating material such as oxygen doped polycrystalline silicon or silicon nitride. However other materials with similar resistance characteristics may be used.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. A semiconductor device having first and second opposed major surfaces, the semiconductor device comprising a semiconductor first region provided between second and third regions such that the second region forms a rectifying junction with the first region and separates the first region from the first major surface and the third region separates the first region from the second major surface, the first region having dispersed therein a plurality of resistive paths each extending through the first region from the second to the third region such that, in use, when a reverse biasing voltage is applied across the rectifying junction an electrical potential distribution is generated along the resistive paths which causes a depletion region in the first region to extend through the first region to the third region to increase the reverse breakdown voltage of the device.

2. A semiconductor device according to claim 1, wherein the second region comprises a semiconductor region of opposite conductivity type to the first region so that the rectifying junction is a pn junction.

3. A semiconductor device according to claim 1, wherein the second region comprises a conductive region forming a Schottky contact with the first region so that the rectifying junction is a Schottky junction.

4. A semiconductor device according to claim 1, wherein the third region comprises a semiconductor region of the same conductivity as but more highly doped than the first region.

5. A semiconductor device according to claim 1, wherein the semiconductor device is a pn-n diode having first and second electrodes and wherein the second region forms an ohmic contact with the first electrode and comprises a semiconductor region of opposite conductivity type to the first region forming a pn junction with the first region and the third region comprises a semiconductor region of the same conductivity as but more highly doped than the first region forming an ohmic contact with the second electrode.

6. A semiconductor device according to claim 1, wherein the semiconductor device is a Schottky diode having first and second electrodes and wherein the second region comprises the first electrode and the first region forms a Schottky contact with the first electrode and the third region comprises a semiconductor region of the same conductivity as but more highly doped than the first region forming an ohmic contact with the second electrode.

7. A semiconductor device according to claim 1, wherein each resistive path is formed as a layer on a surface of an opening extending through the first region.

8. A semiconductor device according to claim 7, wherein the opening is filled by a filler material.

9. A semiconductor device according to claim 1, wherein the resistive paths are separate discrete resistive paths.

10. A semiconductor device according to claim 1, wherein the resistive paths form a grid or network within the first region.

11. A semiconductor device according to claim 1, wherein the resistive paths are formed as a continuous resistive region within a grid or mesh-like trench formed within the first region.

12. A semiconductor device according to claim 1, wherein each resistive path is formed of a material selected from the group consisting of oxygen doped polycrystalline silicon and a silicon nitride.

13. A semiconductor device according to claim 1, wherein each resistive path is separated from the first region by an insulating region.

* * * * *